(12) United States Patent
Yokoi et al.

(10) Patent No.: US 12,041,724 B2
(45) Date of Patent: Jul. 16, 2024

(54) ALLOWANCE SETTING SYSTEM, SUBSTRATE INSPECTION DEVICE, ALLOWANCE SETTING METHOD, AND SUBSTRATE INSPECTION METHOD

(71) Applicant: FUJI CORPORATION, Chiryu (JP)

(72) Inventors: Yuta Yokoi, Kariya (JP); Mitsutaka Inagaki, Anjo (JP); Kazuya Kotani, Toyota (JP); Keiichi Ono, Anjo (JP)

(73) Assignee: FUJI CORPORATION, Chiryu (JP)

( * ) Notice: Subject to any disclaimer, the term of this patent is extended or adjusted under 35 U.S.C. 154(b) by 348 days.

(21) Appl. No.: 17/619,957

(22) PCT Filed: Jun. 21, 2019

(86) PCT No.: PCT/JP2019/024830
§ 371 (c)(1),
(2) Date: Dec. 16, 2021

(87) PCT Pub. No.: WO2020/255412
PCT Pub. Date: Dec. 24, 2020

(65) Prior Publication Data
US 2022/0322593 A1    Oct. 6, 2022

(51) Int. Cl.
*H05K 13/08*   (2006.01)
(52) U.S. Cl.
CPC .................. *H05K 13/083* (2018.08)
(58) Field of Classification Search
None
See application file for complete search history.

(56) References Cited

U.S. PATENT DOCUMENTS

| | | | |
|---|---|---|---|
| 6,047,084 A * | 4/2000 | Kent | H05K 13/083 348/126 |
| 2017/0112029 A1* | 4/2017 | Shimizu | H05K 13/0815 |

FOREIGN PATENT DOCUMENTS

| | | |
|---|---|---|
| EP | 2 717 666 A1 | 4/2014 |
| WO | WO 2014/080502 A1 | 5/2014 |

OTHER PUBLICATIONS

International Search Report mailed on Sep. 17, 2019 in PCT/JP2019/024830 filed on Jun. 21, 2019 (2 pages).

* cited by examiner

*Primary Examiner* — Herbert K Roberts
(74) *Attorney, Agent, or Firm* — Oblon, McClelland, Maier & Neustadt, L.L.P.

(57) ABSTRACT

An allowance setting system, a substrate inspection device, an allowance setting method, and a substrate inspection method that can set an appropriate inspection allowance are provided in which a normal mounting position of electronic component on a component mounting surface of substrate is defined as normal position. A deviation of an actual mounting position of electronic component in a surface direction of the component mounting surface with respect to the normal position is defined as surface direction deviation. A deviation of the actual mounting position of electronic component in a rotation direction within the component mounting surface with respect to normal position is defined as angular deviation. Allowance setting system sets multiple surface direction inspection allowances according to angular deviation for evaluating surface direction deviation in a substrate inspection before reflow.

4 Claims, 3 Drawing Sheets

| i | Cθ (°) | CX (μm) | CY (μm) |
|---|--------|---------|---------|
| 1 | 0~1 | 200 | 100 |
| 2 | 1~5 | 150 | 90 |
| 3 | 5~10 | 100 | 80 |

ALLOWANCE SETTING SYSTEM, SUBSTRATE INSPECTION DEVICE, ALLOWANCE SETTING METHOD, AND SUBSTRATE INSPECTION METHOD

TECHNICAL FIELD

The present disclosure relates to an allowance setting system for setting an inspection allowance used for substrate inspection before reflow and an allowance setting method, and a substrate inspection device for inspecting a substrate using the inspection allowance and a substrate inspection method.

BACKGROUND ART

As disclosed in Patent Literature 1, an electronic component mounter, a substrate appearance inspection device before reflow, and a reflow furnace are disposed in a production line of a substrate. The electronic component mounter mounts an electronic component at a predetermined mounting coordinates on a component mounting surface of a substrate. The substrate appearance inspection device before reflow inspects a positional deviation of the electronic component with respect to a normal position (normal mounting position) using a predetermined inspection allowance.

The electronic component mounter determines the mounting coordinates of the electronic component based on a predetermined mounting standard. If there is a print deviation of solder on a pad (land) of the substrate, a surface tension of the molten solder may cause a phenomenon that the electronic component moves to a center of the pad (self-alignment) at the time of reflow. When mounting an electronic component having a large self-alignment effect (for example, an electronic component with a light weight) on the substrate, the electronic component mounter determines the mounting coordinates of the electronic component using the solder printed on the substrate as the mounting standard.

PATENT LITERATURE

Patent Literature 1: International Publication No. WO2014/080502A1

BRIEF SUMMARY

Technical Problem

However, an amount of movement (an amount of self-alignment) of an electronic component due to the self-alignment is not determined only by the unique characteristics of the electronic component (for example, the weight of the electronic component). The amount of self-alignment depends on a degree of angular deviation of the electronic component (deviation of the electronic component in the rotation direction in the component mounting surface on the substrate). However, the inspection allowance of a substrate appearance inspection device before reflow is set for each type of electronic component.

The influence of the angular deviation on the self-alignment amount is not considered in the inspection allowance. Therefore, it is difficult to set an appropriate inspection allowance. Therefore, the present disclosure has an object to provide an allowance setting system, a substrate inspection device, an allowance setting method, and a substrate inspection method that can set an appropriate inspection allowance.

Solution to Problem

In an allowance setting system in the present disclosure, when a normal mounting position of an electronic component on a component mounting surface of a substrate is defined as a normal position, a deviation of an actual mounting position of the electronic component in a surface direction of the component mounting surface with respect to the normal position is defined as a surface direction deviation, and a deviation of the actual mounting position of electronic component in a rotation direction within the component mounting surface with respect to the normal position is defined as an angular deviation, the system is configured to set multiple surface direction inspection allowances according to the angular deviation for evaluating the surface direction deviation in a substrate inspection before reflow.

A substrate inspection device in the present disclosure is configured to acquire the surface direction deviation and the angular deviation of the electronic component mounted on the substrate before reflow, and compare the acquired surface direction deviation with the multiple surface direction inspection allowances set by the allowance setting system, to perform a pass or fail determination.

In an allowance setting method in the present disclosure, when a normal mounting position of an electronic component with respect to a component mounting surface of a substrate is defined as a normal position, a deviation of an actual mounting position of the electronic component in a surface direction of the component mounting surface with respect to the normal position is defined as a surface direction deviation, and a deviation of the actual mounting position of the electronic component in a rotation direction within the component mounting surface with respect to the normal position is defined as an angular deviation, multiple surface direction inspection allowances according to the angular deviation are set for evaluating the surface direction deviation in a substrate inspection before reflow.

A substrate inspection method in the present disclosure includes a deviation acquisition step of acquiring the surface direction deviation and the angular deviation of the electronic component mounted on the substrate before reflow, and a determination step of comparing the acquired surface direction deviation with the multiple surface direction inspection allowances set by the allowance setting method, to perform a pass or fail determination.

Advantageous Effects

According to an allowance setting system and an allowance setting method in the present disclosure, multiple surface direction inspection allowances can be set in accordance with an angular deviation. Therefore, it is possible to set an appropriate surface direction inspection allowance in which an influence of angular deviation on an amount of self-alignment of the electronic component is considered. In addition, according to the substrate inspection device and the substrate inspection method in the present disclosure, it is possible to inspect the substrate using the appropriate surface direction inspection allowance corresponding to the angular deviation. Therefore, an inspect accuracy can be improved.

DESCRIPTION OF EMBODIMENTS

Hereinafter, an embodiment of an allowance setting system, a substrate inspection device, an allowance setting method, and a substrate inspection method in the present disclosure will be described.

Production System

Figure 1:
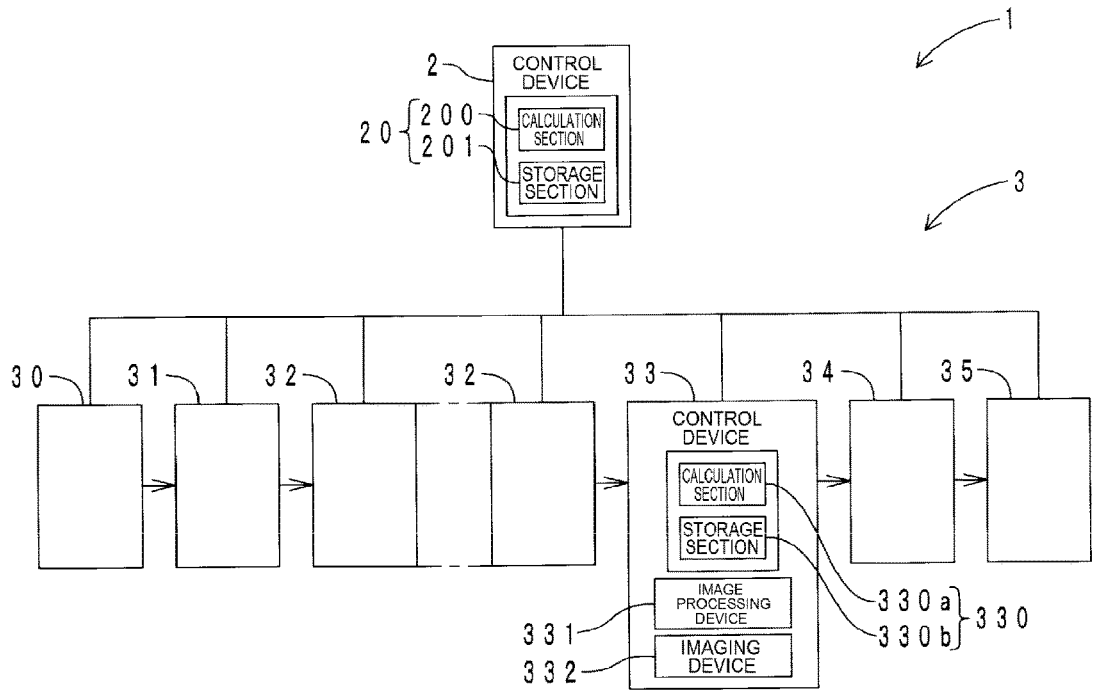
FIG. 1 is a schematic diagram of a production system.

First, a configuration of a production system in the present embodiment will be described. FIG. 1 shows a schematic diagram of a production system. As shown in FIG. 1, production system 1 includes management computer 2 and production line 3. Management computer 2 is included in a concept of "allowance setting system" in the present disclosure.

Management computer 2 includes control device 20. Control device 20 includes calculation section (for example, CPU, and the like) 200 and storage section (for example, ROM, RAM, and the like) 201. Storage section 201 stores substrate-related data (for example, substrate type, data relating to a dimension, data relating to a substrate pad position, data relating to the electronic component type, dimension, and mounting position, data relating to a mounting order of multiple electronic components, data relating to a terminal position of the electronic component, inspection allowance data used at the time of substrate inspection before reflow, and the like). Among the substrate-related data, the inspection allowance data will be described later.

Production line 3 includes solder printer 30, solder printing inspector 31, multiple electronic component mounters 32, substrate appearance inspection device before reflow 33, reflow furnace 34, and substrate appearance inspection device after reflow 35. Substrate appearance inspection device before reflow 33 is included in a concept of "substrate inspection device" in the present disclosure.

Management computer 2 and each device configuring production line 3 (solder printer 30, solder printing inspector 31, multiple electronic component mounters 32, substrate appearance inspection device before reflow 33, reflow furnace 34, and substrate appearance inspection device after reflow 35) are electrically connected to each other. Management computer 2 and each of the above-described devices can communicate in both directions. Each of the above-described devices is disposed in the substrate conveyance direction. Substrate is conveyed from an upstream side (solder printer 30 side) toward a downstream side (substrate appearance inspection device after reflow 35 side).

Substrate appearance inspection device before reflow 33 includes control device 330, image processing device 331, and imaging device (for example, a CCD camera, a CMOS camera, and the like) 332. The control device 330 includes calculation section 330a and storage section 330b. Imaging device 332 images an upper surface (component mounting surface) of the substrate before reflow, and acquires image data. Image processing device 331 performs predetermined image processing on the image data. Calculation section 330a inspects the mounting state of the electronic component based on the image data.

(Allowance Setting Method)

Figure 2:
FIG. 2 is a partial top view of a substrate before reflow.
Figure 2:
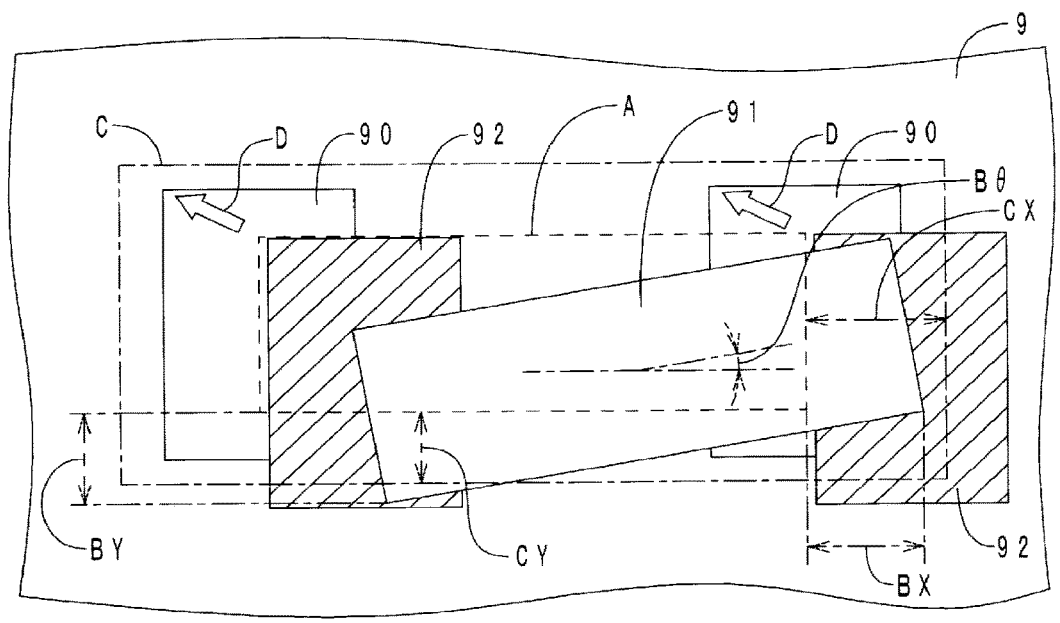

Next, an allowance setting method in the present embodiment will be described. The inspection allowance set in the allowance setting method described below is used when inspecting a positional deviation of a mounting position of the electronic component in the substrate appearance inspection device before reflow 33. The allowance setting method is executed by management computer 2. FIG. 2 shows a partial top view of the substrate before reflow. For convenience of explanation, solder 92 is hatched. As shown in FIG. 2, a normal mounting position of electronic component 91 with respect to pad 90 on the upper surface (component mounting surface) of substrate 9 is defined as normal position A, a deviation of an actual mounting position of electronic component 91 with respect to normal position A in the horizontal direction (surface direction of the upper surface of substrate 9) is defined as X-direction deviation BX and Y-direction deviation BY, and a deviation of the actual mounting position of electronic component 91 with respect to normal position A in the θ-direction (rotation direction) within the upper surface of substrate 9 is defined as angular deviation Bθ. X-direction deviation BX and Y-direction deviation BY are included in a concept of "surface direction deviation" in the present disclosure.

Electronic component mounter 32 shown in FIG. 1 mounts electronic component 91 on the upper surface of substrate 9 with solder 92 as the mounting standard. When substrate 9 shown in FIG. 2 passes through reflow furnace 34 shown in FIG. 1, electronic component 91 moves to normal position A due to the self-alignment effect indicated by arrow D in FIG. 2. X-direction deviation BX, Y-direction deviation BY, and angular deviation Bθ are corrected.

Figures 3, 4:
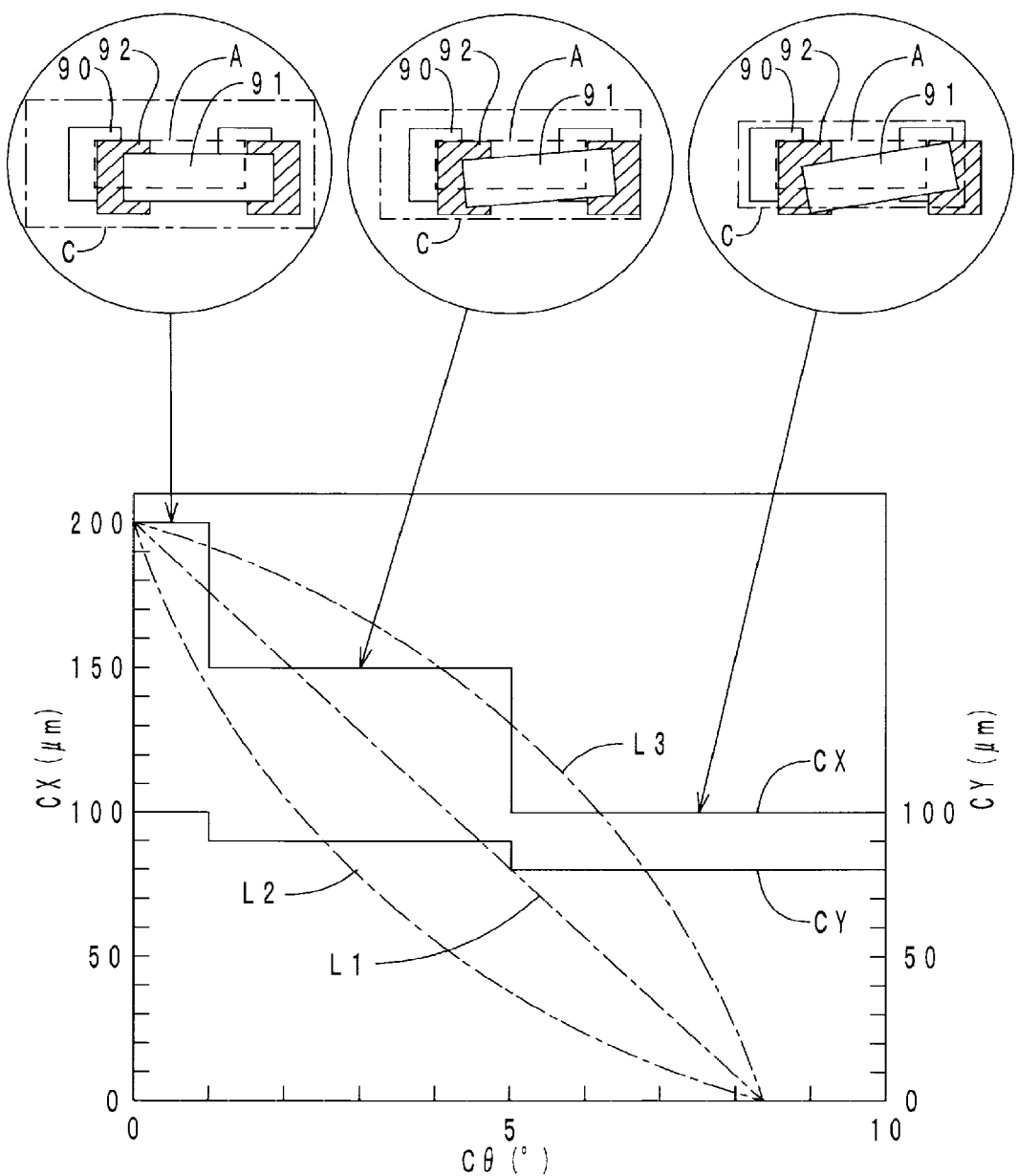
FIG. 3 is a schematic diagram of inspection allowance data in a table format.
FIG. 4 is a schematic diagram of an inspection allowance data in a graph format.

FIG. 3 shows a schematic diagram of inspection allowance data in a table format. FIG. 4 shows a schematic diagram of the same inspection allowance data in a graph format. Management computer 2 shown in FIG. 1 stores the inspection allowance data shown in FIG. 3 in storage section 201. The inspection allowance data is individually set for multiple electronic components 91 mounted with solder 92 as the mounting standard. The inspection allowance data includes multiple (i=1 to 3) allowance sets (a set of angle inspection allowance Cθ, X-direction inspection allowance CX, and Y-direction inspection allowance CY). X-direction inspection allowance CX and Y-direction inspection allowance CY are included in a concept of "surface direction inspection allowance" in the present disclosure.

As angular deviation Bθ of electronic component 91 shown in FIG. 2 increases, it is more difficult for electronic component 91 to move at the time of reflow. Therefore, as angular deviation Bθ of electronic component 91 shown in FIG. 2 increases, the amount of self-alignment in the X-direction and the amount of self-alignment of in the Y-direction decrease. Therefore, as shown in FIG. 4, the inspection allowance data is set such that X-direction inspection allowance CX and Y-direction inspection allowance CY decrease as angle inspection allowance Cθ increases, in other words, allowance area C decreases as angle inspection allowance Cθ increases.

(Substrate Inspection Method)

Figure 5:
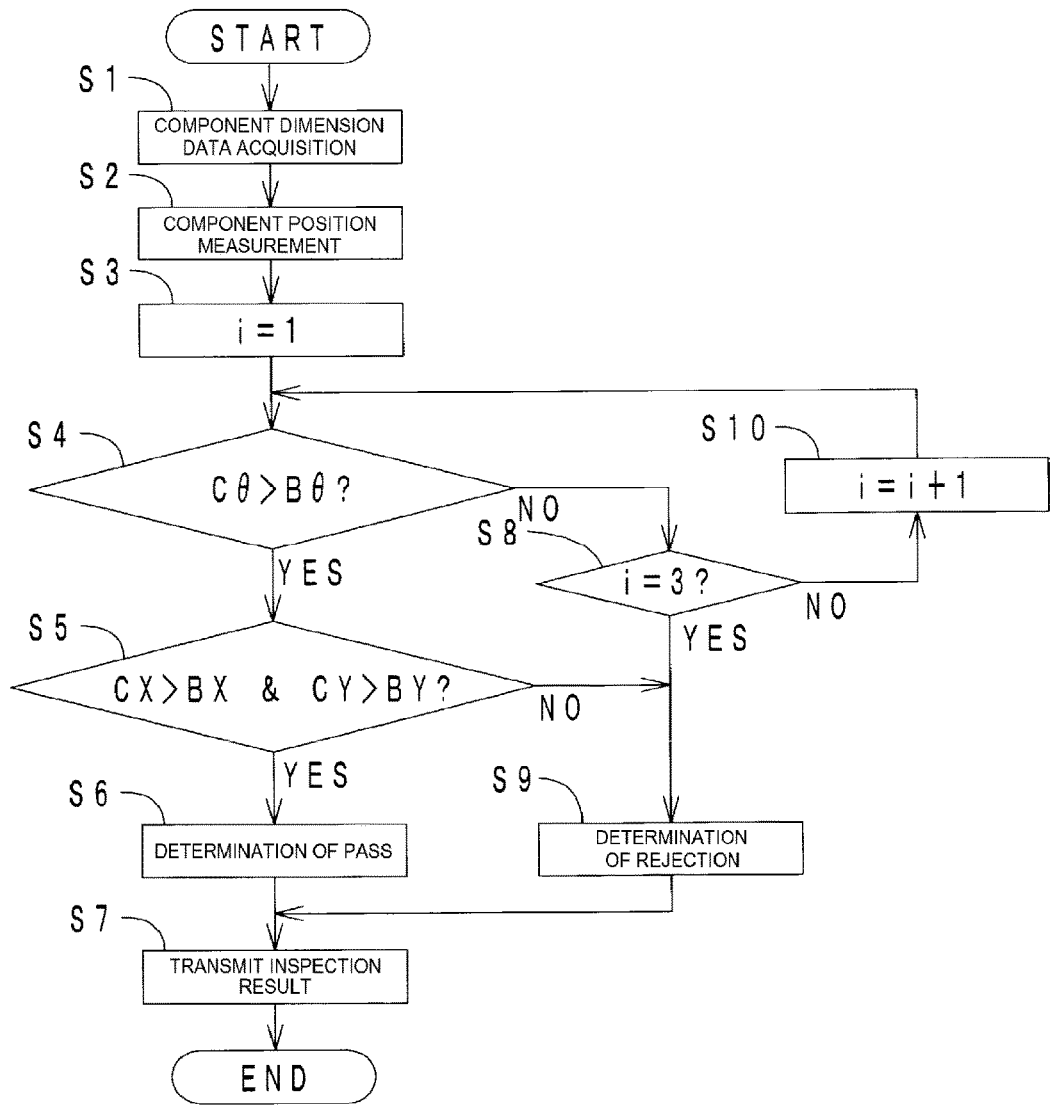
FIG. 5 is a flowchart of a substrate inspection method.

Next, the substrate inspection method in the present embodiment will be described. The following is a description for a case of inspecting the mounting state of electronic component 91 shown in FIG. 2 in substrate appearance inspection device before reflow 33 shown in FIG. 1. FIG. 5 shows a flowchart of the substrate inspection method. S (step) 2 in FIG. 5 corresponds to a "deviation acquisition step" in the present disclosure. S4 to S10 in FIG. 5 correspond to a "determination step" in the present disclosure.

First, calculation section 330a of substrate appearance inspection device before reflow 33 acquires the component dimension data and inspection allowance data (refer to FIG. 3) of electronic component 91 which is an inspection target from storage section 201 of management computer 2 shown in FIG. 1 (S1 in FIG. 5). Next, calculation section 330a drives imaging device 332 to image the vicinity of normal position A of electronic component 91 on substrate 9, and acquire image data. Image processing device 331 performs predetermined image processing on the image data. Calculation section 330a measures the actual mounting position of electronic component 91 based on the image data (S2 in FIG. 5). Calculation section 330a recognizes, for example, the XY-coordinates of four corners of electronic component 91 and specifies the contour of electronic component 91. Calculation section 330a measures X-direction deviation BX, Y-direction deviation BY, and angular deviation B$\theta$ of electronic component 91 based on the contour of the electronic component. Calculation section 330a counts i=1 (S3 in FIG. 5) and compares actual angular deviation B$\theta$ of electronic component 91 with angle inspection allowance C$\theta$ (equal to or more than 0° and less than 1°) when i=1 in FIG. 3 (S4 in FIG. 5).

As a result of comparison in S4 in FIG. 5, when angular deviation B$\theta$ is less than angle inspection allowance C$\theta$ (when C$\theta$>B$\theta$, when angular deviation B$\theta$ is within a range of angle inspection allowance C$\theta$), calculation section 330a compares actual X-direction deviation BX of electronic component 91 with X-direction inspection allowance CX (within 200 μm) when i=1 in FIG. 3. In addition, actual Y-direction deviation BY of electronic component 91 and Y-direction inspection allowance CY (within 100 μm) when i=1 in FIG. 3 are compared (S5 in FIG. 5).

In S5 in FIG. 5, when X-direction deviation BX is less than X-direction inspection allowance CX and Y-direction deviation BY is less than Y-direction inspection allowance CY (CX>BX and CY>BY), calculation section 330a issues a pass determination for electronic component 91 (S6 in FIG. 5). After that, calculation section 330a transmits the determination result to management computer 2 (S7 in FIG. 5). In S5 in FIG. 5, when X-direction deviation BX is equal to or more than X-direction inspection allowance CX, or when Y-direction deviation BY is equal to or more than Y-direction inspection allowance CY (CX≤BX and/or CY≤BY), calculation section 330a issues a fail determination for electronic component 91 (S9 in FIG. 5).

For electronic component 91 shown in FIG. 2, since X-direction deviation BX is less than X-direction inspection allowance CX (CX>BX), but Y-direction deviation BY exceeds Y-direction inspection allowance CY (CY<BY), calculation section 330a issues the fail determination (S9 in FIG. 5).

As a result of comparison in S4 in FIG. 5, when angular deviation B$\theta$ is equal to or more than angle inspection allowance C$\theta$ (when C$\theta$≤B$\theta$, when angular deviation B$\theta$ is outside the range of angle inspection allowance C$\theta$), calculation section 330a counts i=2 (S8 and S10 in FIG. 5) and compares angular deviation B$\theta$ with angle inspection allowance C$\theta$ (equal to or more than 1° and less than 5°) when i=2 in FIG. 3 (S4 in FIG. 5). Subsequent processing is as described above As a result of comparison in S4 in FIG. 5 when i=2, when angular deviation B$\theta$ is equal to or more than angle inspection allowance C$\theta$ (when C$\theta$≤B$\theta$, when angular deviation B$\theta$ is outside the range of angle inspection allowance C$\theta$), calculation section 330a counts i=3 (S8 and S10 in FIG. 5) and compares angular deviation B$\theta$ with angle inspection allowance C$\theta$ (equal to or more than 5° and less than 10°) when i=3 in FIG. 3 (S4 in FIG. 5). Subsequent processing is as described above As a result of comparison in S4 in FIG. 5 when i=3, when angular deviation B$\theta$ is equal to or more than angle inspection allowance C$\theta$ (when C$\theta$≤B$\theta$, when angular deviation B$\theta$ is outside the range of angle inspection allowance C$\theta$), calculation section 330a issues a fail determination for electronic component 91 (S8 and S9 in FIG. 5).

As described above, in the substrate inspection method in the present embodiment, the allowance set of i=1 to 3 is applied to electronic component 91 in order from i=1. The inspection is similarly executed for other electronic components 91 on substrate 9. When calculation section 330a issues the pass determination for all electronic components 91 on substrate 9, substrate 9 is conveyed to reflow furnace 34 shown in FIG. 1.

(Working Effects)

Next, working effects of management computer 2, substrate appearance inspection device before reflow 33, the allowance setting method, and the substrate inspection method in the present embodiment will be described. As shown in FIG. 3, according to management computer 2 and allowance setting method in the present embodiment, multiple allowance areas C (X-direction inspection allowance CX, Y-direction inspection allowance CY) can be set according to the angular deviation (angle inspection allowance C$\theta$). Therefore, it is possible to set appropriate allowance area C in which the influence of the angular deviation on the amount of self-alignment of electronic component 91 shown in FIG. 2 is considered. In addition, according to substrate appearance inspection device before reflow 33 and the substrate inspection method in the present embodiment, substrate 9 can be inspected by using appropriate multiple allowance area C corresponding to the angular deviation. Therefore, an inspect accuracy can be improved.

As shown in FIG. 3, the inspection allowance data includes multiple (i=1 to 3) allowance sets (a set of angle inspection allowance C$\theta$, X-direction inspection allowance CX, and Y-direction inspection allowance CY). The inspection allowance data is set such that X-direction inspection allowance CX and Y-direction inspection allowance CY decrease as angle inspection allowance C$\theta$ (angular deviation B$\theta$ of electronic component 91 shown in FIG. 2) increases.

Therefore, it is possible to cope with the phenomenon that the amount of self-alignment decreases as angular deviation B$\theta$ of electronic component 91 increases.

{Others}

As described above, the embodiment of the allowance setting system, the substrate inspection device, the allowance setting method, and the substrate inspection method according to the present disclosure was described. However, the embodiments are not particularly limited to the above embodiment. It is also possible to implement the present disclosure in various modifications and improvements which can be made by those skilled in the art.

The allowance setting system may be disposed inside production line 3 or outside production line 3. A single allowance setting system may be shared by multiple production lines 3. The allowance setting system may be integrated with or separate from the substrate inspection device. The allowance setting method and the substrate inspection method in the present embodiment may be executed by control device 330 of substrate appearance inspection device before reflow 33 shown in FIG. 1. In this case, substrate appearance inspection device before reflow 33 is included in a concept of the allowance setting system and the substrate inspection device in the present disclosure. In addition, the allowance setting method in the present embodiment may be executed by a control device that is included in at least one of solder printer 30, solder printing inspector 31, multiple electronic component mounters 32, and substrate appearance inspection device after reflow 35 shown in FIG. 1. In this case, the device that includes the control device is included in a concept of the allowance setting system in the present disclosure.

The number of allowance sets for the inspection allowance data shown in FIG. 3 is not particularly limited. The number of sets may be equal to or more than two. As indicated by correlation lines (dashed lines) L1 to L3 in FIG. 4, X-direction inspection allowance CX may be continuously changed according to angle inspection allowance Cθ, that is, angular deviation Bθ. The shape of the correlation line between angular deviation Bθ and X-direction inspection allowance CX is not particularly limited. The shape may be straight line (L1), concave shape curved line (L2), or convex shape curved line (L3). The same applies to Y-direction inspection allowance CY. The multiple surface direction inspection allowances that are set according to angular deviation Bθ may be at least one of X-direction inspection allowance CX and Y-direction inspection allowance CY. For example, only multiple X-direction inspection allowances CX may be set, and Y-direction inspection allowance CY may be defined as a constant value. Of course, the reverse may be applied.

X-direction inspection allowance CX and Y-direction inspection allowance CY shown in FIG. 2 may be set with considering a dimensional tolerance of electronic component 91. The dimensional tolerance of electronic component 91 may be acquired from the component dimension data shown in S1 of FIG. 5. The storage location of the inspection allowance data shown in FIG. 3 and the component dimension data shown in S1 in FIG. 5 may be, for example, storage section 201 of management computer 2 or a storage section of each device (solder printer 30, solder printing inspector 31, multiple electronic component mounters 32, substrate appearance inspection device before reflow 33, reflow furnace 34, and substrate appearance inspection device after reflow 35) constituting production line 3. The inspection allowance data and the component dimension data may be stored in storage sections of separate devices.

The types of electronic component 91 to which the allowance setting system, the substrate inspection device, the allowance setting method, and the substrate inspection method in the present disclosure are applied are not particularly limited. Electronic component 91 having a light weight (for example, an electronic component having a length of equal to or less than 1 mm and a width of equal to or less than 0.5 mm) has a large self-alignment effect. Therefore, electronic component 91 having a light weight is often mounted on the upper surface of substrate 9 with solder 92 as the mounting standard. The allowance setting system, the substrate inspection device, the allowance setting method, and the substrate inspection method in the present disclosure may be applied to such electronic component 91 having a light weight. The type of substrate inspection device is not particularly limited. For example, it may be a substrate inspection device of a type of using a laser for that performing the substrate inspection.

REFERENCE SIGNS LIST

1: production system, 2: management computer (allowance setting system), 3: production line, 9: substrate, 20: control device, 30: solder printer, 31: solder printing inspector, 32: electronic component mounter, 33: substrate appearance inspection device before reflow (substrate inspection device), 34: reflow furnace, 35: substrate appearance inspection device after reflow, 90: pad, 91: electronic component, 92: solder, 200: calculation section, 201: storage section, 330: control device, 330a: calculation section, 330b: storage section, 331: image processing device, 332: imaging device, A: normal position, Bθ: angular deviation, BX: X-direction deviation (surface direction deviation), BY: Y-direction deviation (surface direction deviation), C: allowance area, Cθ: angle inspection allowance, CX: X-direction inspection allowance (surface direction inspection allowance), CY: Y-direction inspection allowance (surface direction inspection allowance)

The invention claimed is:

1. An allowance setting system comprising:
an electronic component;
a substrate including a component mounting surface; and
a processor configured to:
   define a normal position as a normal mounting position of the electronic component on the component mounting surface of the substrate with reference to a printing position of a solder on the component mounting surface of the substrate,
   define a surface direction deviation as a deviation of an actual mounting position of the electronic component in a surface direction of the component mounting surface with respect to the normal position,
   define an angular deviation as a deviation of the actual mounting position of the electronic component in a rotation direction within the component mounting surface with respect to the normal position, and
   set inspection allowance data for evaluating the surface direction deviation in a substrate inspection before reflow, the inspection allowance data including multiple inspection allowance sets in which for each inspection allowance set, a range of angular deviations is provided for a value of a surface direction inspection allowance,
wherein in the inspection allowance data, the surface direction inspection allowance decreases as an upper value of the range of angular deviations increases.

2. A substrate inspection device comprising:
the allowance setting system according to claim 1;
a camera configured to image the electronic component mounted on the substrate before reflow; and
a processor configured to:
acquire the surface direction deviation and the angular deviation of the electronic component mounted on the substrate before reflow based on the image, and
compare the acquired surface direction deviation and the acquired angular deviation with the inspection allowance data set by the allowance setting system to perform a pass or fail determination.

3. An allowance setting method comprising:
providing an electronic component, and a substrate including a component mounting surface;
defining a normal position as a normal mounting position of the electronic component with respect to the component mounting surface of the substrate with reference to a printing position of a solder on the component mounting surface of the substrate, defining a surface direction deviation as a deviation of an actual mounting position of the electronic component in a surface direction of the component mounting surface with respect to the normal position, defining an angular deviation as a deviation of the actual mounting position of the electronic component in a rotation direction within the component mounting surface with respect to the normal position, and setting inspection allowance data for evaluating the surface direction deviation in a substrate inspection before reflow, the inspection allowance data including multiple inspection allowance sets in which for each inspection allowance set, a range of angular deviations is provided for a value of surface direction inspection allowance, wherein in the inspection allowance data, the surface direction inspection allowance decreases as an upper value of the range of angular deviations increases.

4. A substrate inspection method comprising:

acquiring the surface direction deviation and the angular deviation of the electronic component mounted on the substrate before reflow, and comparing the acquired surface direction deviation and the acquired angular deviation with the inspection allowance data set by the allowance setting method according to claim 3, to perform a pass or fail determination.

* * * * *